US005189332A

United States Patent [19]

Wild

[11] Patent Number: 5,189,332

[45] Date of Patent: Feb. 23, 1993

[54] FLEXIBLE ENERGY COUPLING AND ASSOCIATED MOUNTING FOR PIEZO ELECTRIC CRYSTALS

[76] Inventor: John J. Wild, 4262 Alabama Ave. So., Minneapolis, Minn. 55416

[21] Appl. No.: 793,622

[22] Filed: Nov. 18, 1991

[51] Int. Cl.[5] ............ H01L 41/08

[52] U.S. Cl. ............ 310/345; 310/327; 310/354; 310/363

[58] Field of Search ............ 310/324, 348, 351-356, 310/327, 363, 364, 334, 336, 345

[56] References Cited

U.S. PATENT DOCUMENTS

| | | | |
|---|---|---|---|
| 2,479,264 | 8/1949 | Rosenberg | 310/354 |
| 2,728,869 | 12/1955 | Pohlman | 310/324 X |
| 2,761,076 | 8/1956 | Hansell | 310/354 |
| 2,961,554 | 11/1960 | Cook et al. | 310/345 X |
| 3,137,836 | 6/1964 | Glover | 310/345 X |
| 3,543,065 | 11/1970 | Phelan | 310/369 X |
| 4,322,652 | 3/1982 | Otsuka | 310/354 X |
| 4,492,892 | 1/1985 | Nakatani | 310/354 X |
| 4,965,483 | 10/1990 | Abe et al. | 310/345 X |

*Primary Examiner*—Mark O. Budd
*Attorney, Agent, or Firm*—James R. Cwayna

[57] ABSTRACT

An energy coupling for piezo-electric crystals and mounting for the crystals wherein the crystal is flexibly edge mounted and isolated from a rigid holder and is backed by a flexible and compressible conductor to which selected frequency energy is transmitted having an adjustable compression plate therebehind for maintaining proper energy transmitting contact between the crystal and conductor for production of a collimated sound beam from the face of the crystal from a plurality of electrodes on the back face of the crystal. The system provides for energy transmission with no possibility of isolation at any frequency other than at the desired frequency of transmission.

12 Claims, 1 Drawing Sheet

FLEXIBLE ENERGY COUPLING AND ASSOCIATED MOUNTING FOR PIEZO ELECTRIC CRYSTALS

RELATED APPLICATIONS

There are no applications currently on file in the United States Patent Office to which this application relates.

FEDERAL SPONSORSHIP

This invention is not made under any Federally sponsored research and development arrangement nor any other sponsored research and development arrangement which should be noted.

FIELD OF THE INVENTION

This invention relates generally to a structure for mounting piezo-electric crystals and the means for conductive connection for energization thereof and more particularly to the structure for flexibly mounting such crystals and flexibly coupling the same to an energy source for energization of the crystal for proper transmission and receipt of energy signals.

SUMMARY OF THE INVENTION

This invention primarily discloses structure for mounting of piezo-electric crystals to provide for transmission and receipt of intrinsically collimated sound beams therefrom and thereto wherein a flexible, resilient, conductor is arranged against the rear surface of the crystal for proper conductance of energy to and from the crystal. The flexible, resilient, conductive element is preferably a metallic impregnated butyl or similar material including silicones which provides pressure damping of the crystal to eliminate high order frequency oscillations and thereby produces a desired band width, high sensitivity, low noise transmitter and detector for maximum transmission and harvest of acoustic energy. Pressurizing and thus damping of the crystal is provided by compressing the impregnated element to the edge mounted crystal and thereby maintaining positive conductive contact between the rear face of the crystal and the front face of the conductive member. The pressure transmitting element may be a simple screw arrangement.

Shape of the crystal includes circular and elliptical as well as rectangular varieties, any of which are selectable to increase the aspects of physical beam shaping and adapt the beam to its use. The crystal itself may be defined as a multiplicity of transmitting and receiving, conductive pads and for this reason it is necessary to maintain conduction to each and every such pad to provide a multiplicity of single, fundamental frequency radiating points on the transducer face.

BACKGROUND AND OBJECTS OF THE INVENTION

In a search of the patented prior art the applicant has found the following U.S. Pat. Nos.: Brooks, 2,388,596; Chalfin, 2,447,160; Bokovoy, et al, 2,434,903; Jensik, et al, 4,985,655; Mooney, et al, 4,540,908; Morse, et al, 4,494,033; Myers, et al, 4,273,399; Wood, et al, 3,518,460; Craig, et al, 3,278,695; Wolfskill, 2,635,199.

The majority of these patents illustrate relatively flexible means for mounting of piezo-electric crystals with secondary means of providing the energy transmission thereto. None, however provide a flexibly conductive compressive element as the connector.

Applicant's device provides an elastic, flexible, resilient compressive coupling for conduction of energy to and from piezo-electric crystals which includes ane elastic mounting of the crystal and thus a completely electrically noiseless energy coupling to the rear side thereof for the transmission and receipt of energies of the desired frequency to and from the crystal. The coupling may be termed surface conductive to supply the proper energy to the entire rear side of the crystal and means are provided to apply pressure thereto for damping of the crystal to reduce ringing or oscillatory effects. Experimentally applicant has found it possible to produce an intrinsically collumated sound beam from a random collection of electrodes on the back face of a high frequency polycrystalline ceramic piezo-electric transducer.

Applicant's structural system then eliminates maximum and minimum nodal intensities, stray harmonic frequencies and side lobes to permit operation at fundamental frequencies of the transducer thus allowing optimal sonic energy return from the target non-linear material.

The thickness of the flexible connector is minimized such that a relatively small length of transmission to control pad diameter ratio exists to insure oscillation of the crystal only at the fundamental frequency of the crystal. In this manner then the crystal acts as an array of small edge-supported transducers having no possibility of oscillation at frequencies other than this fundamental frequency. It is necessary that the overall crystal be flexibly edge-mounted to insure that all transducer/detectors vibrate in the same fashion for reproducible results.

It is therefore an object of the applicant's invention to provide a means for mounting a piezo-electric crystal and maintaining conductive, flexible, resilient energy connection therewith for the transmission of and receipt of collimated sound beams therefrom and thereto.

It is a further object of the applicant's invention to provide a structure for mounting of a piezo-electric crystal and energizing the same through a flexible, resilient conductor in a manner to control or limit the crystal oscillation to a desired fundamental frequency.

It is a further object of the applicant's invention to provide a flexible mounting structure for a piezo-electric crystal which includes a flexible, resilient energy conductor therebehind which conductor is elastic to permit and provide for pressure application thereto for prevention of unwanted crystal oscillation and insure transmission and receipt of a collumated sound beam at desired non-interfered frequencies.

These and other objects and advantages of the applicant's invention will more fully appear from a consideration of the accompanying drawings and disclosures.

DESCRIPTION OF PREFERRED FORMS OF THE INVENTION

In accordance with the accompanying drawings applicant illustrates his flexible, conductive coupling device in both single form arcuate 10 and rectangular, multiple form 40. It should be understood that the primary principles of the applicant's invention are to initially provide a mounting for a piezo-electric crystal in a dampenable position and providing means for providing a flexible, elastic, energy transmission coupling and dampening structure thereto. Such a unit provides for total energy transmission to the rear surface of the crystal for proper energy transmission and reception from the front surface thereof at desired fundamental frequency, thus eliminating higher order oscillations and thereby producing a very narrow band wave, high sensity, low noise transmitter and detector for maximum harvest for return of acoustic energy which is of particular interest for analyzing human tissue.

Figure 1:
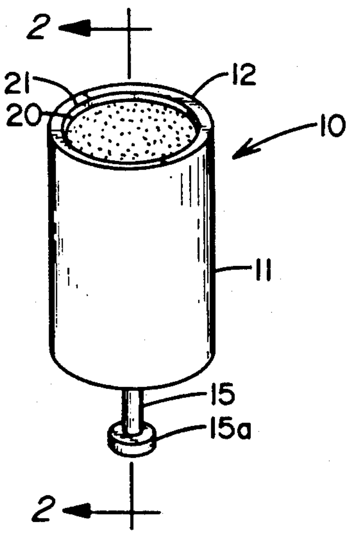
FIG. 1 is a perspective view of an arcuate piezo-electric crystal mounted in accordance with the applicant's invention.
Figure 2:
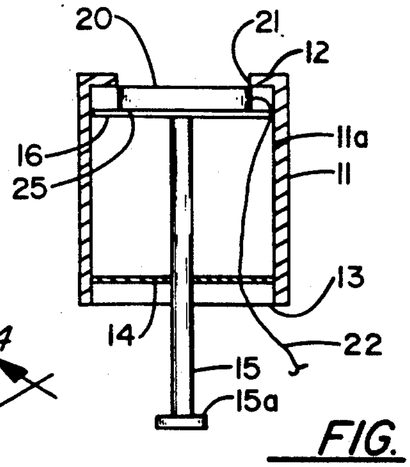
FIG. 2 is a longitudinal section taken substantially along line 2—2 of FIG. 1.

As illustrated in FIGS. 1 and 2, an external, substantially rigid, arcuate housing 11 having a lipped end 12 and an open end 13 is provided with the open end 13 affording a supporting spider 14. The purpose of spider 14 is to accommodate, in the form shown, a manually adjustable, threaded shaft 15 for positioning a compression plate 16 into the interior 11*a* of body 11 through manipulation of a control knob 15*a*. The piezo-electric crystal 20 is mounted to the inwardly directed area of lip 12 of housing 11. A flexible adhesive 21, such as butyl, provides the edge mounting of crystal 20 to lip 12.

Figure 5:
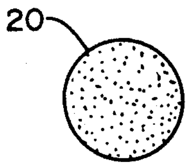
FIG. 5 is a rear view of the arcuate form of the invention illustrating the piezo-electric crystal and the multiplicity of conductor pads for transmission and receipt of energy.

The multiplicity of conductor pad areas of the crystal 20 is illustrated by the rear view of FIG. 5. For proper conductance it is obvious that all of these areas must be energizable and energy must be transmittable therefrom. A conductor of the energy is illustrated at 22.

The flexible coupling element is designated in its entirety 25 and may consist of a butyl or other compressible, flexible, resilient elastic material impregnated to a high density with highly conductive metallic constituents such as silver, gold or platinum. As illustrated in FIG. 2 the arcuate dimension of the conductive element 25 is selected to provide for total and proper conducting contact to crystal 20.

The compressive force for maintaining energy coupling to the crystal 20 is provided by plate 16, screw and knob elements 15, 15*a*. With this simple device, as shown, the oscillation of the crystal 20 is substantially eliminated to thereby eliminate ringing effects and permit energy transmission and receipt at only the desired frequency providing an electrically noiseless transmission.

Figure 3:
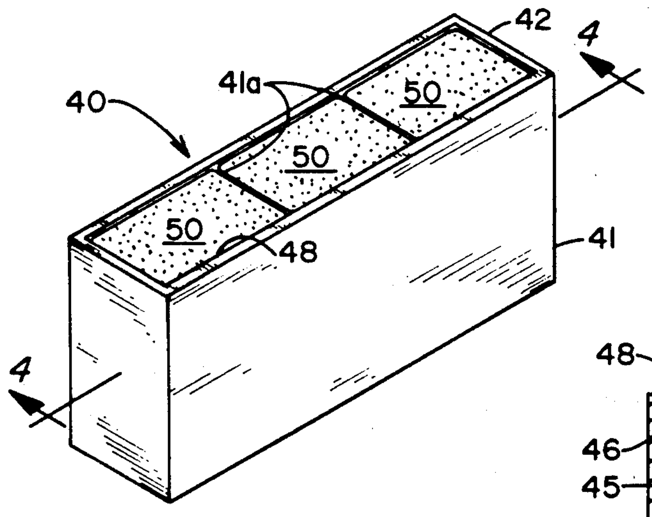
FIG. 3 is a perspective view of a crystal device embodying the concepts of applicant's invention and illustrated with a rectangular crystal configuration.
Figure 4:
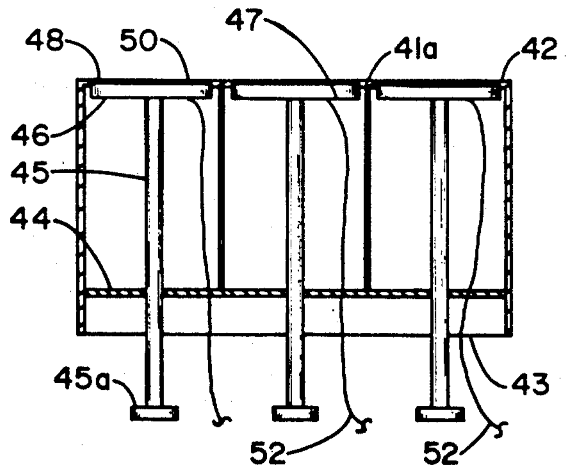
FIG. 4 is a vertical longitudinal section taken substantially along line 4—4 of FIG. 3.
Figure 6:
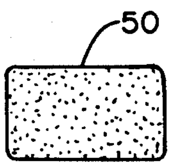
FIG. 6 is a view similar to FIG. 5 illustrating a rectangular form of crystal.

The structure as illustrated in FIGS. 3, 4 and 6 basically illustrate applicant's concept to other than an arcuate crystal. In the form shown a rectangular housing 41 having a lipped end 42 and an open end 43 is provided having a supporting member 44 arranged therein to threadably receive threaded rods 45 having control knobs 45*a* therethrough to position plates 46 against the flexible coupling members 47. Again the crystals are respectively designated 50 and are flexibly, adhesively mounted to a surrounding lip 42 of housing 41 and eletal framework 41*a* arranged therein by flexible adhesive material 48 which provides for limited edge restraint of the crystals 50. Conductors 52 extend from the flexible conductors 47 to the remote energy supply and readout devices. The structure of FIGS. 3 and 4 facilitates an in-line array of crystals and illustrates a variation wherein crystals may be arranged in side by side fashion while still achieving singular mounting for the crystals for the proper operation thereof in dampened, desired energy transmission and reception position.

FIG. 6 illustrates the multiplicity of contact pads of the rear side of the crystal when in rectangular shape and further illustrates the smoothly curved corners of the crystal in this shape.

It should be obvious that the positionable plates 16, 46 in the respective forms are of non-conductive material.

In each instance the relatively small length, due to crystal thickness, to diameter ratio of the conductive contact pads on the rear side of the crystal insures oscillation of the crystal at the fundamental frequency of the crystal as the same is mounted and pressurized by the positionable plate structure. In each manner illustrated, as well as obvious variations thereof, the crystal acts as an array of small edge-supported transducers having no possibility of oscillation at frequencies other than its fundamental frequency.

Although simplistically illustrated, particularly with regard to pressuring of the crystal, the applicant does illustrate herein a new and unique flexible conductive coupling for piezo-electric crystals which will insure oscillation of the crystals at a selected frequency to provide energy transmission at such desired frequency without distortion and which will receive energy from the article being examined with minimal back spray problems.

What I claim Is:

1. Flexible conductive mounting structure for piezo-electric crystal, including:

a. a rigid, hollow, generally longitudinally extending housing having an open end or a shouldered end;

b. flexible adhesive means attaching the outer periphery of the crystal to the innermost portion of said housing shoulder end;

c. a flexible, compressive conductor member interiorally of said housing and arranged in transmitting position to the rear surface of the crystal;

d. means for providing energy to and receiving energy from said conductor member whereby such energy is conducted to the crystal;

e. means for applying a compressive force longitudinally of said housing to said conductor member.

2. The structure as set forth in claim and said means for applying the compressive force to said conductor member including:

a. a non-conductive plate element compatible in size to said conductor member and abutting said conductor member; and, b. means for applying a longitudinal positioning force to said plate.

3. The structure as set forth in claim 2 and said means for applying a longitudinal positioning force to said plate including:

a. a threaded support interiorally of said housing; and, b. a threaded advancement screw through said support and engaging one side of said plate.

4. The structure as set forth in claim 1 and said compressive conductor member including a flexible, compressive material impregnated with high conductive metallic particles.

5. The structure as set forth in claim 1 wherein the piezo-electric crystal consists of a plurality of spaced, energy transmitting and energy receiving conductors spaced therethrough transmitting energy through the same and providing a plurality of conductor pads on the rear surface there, said compressive conductor member providing energy connection to each of said pads.

6. The structure as set forth in claim 1 wherein the ratio of the diameter of the conductor pads to the thickness of the crystal is maintained at a level to provide an energy beam transmission from and to the crystal which is of collimated configuration.

7. The structure as set forth in claim 1 wherein said compressive conductor member and said means for applying compressive force thereto combined with the edge mounting of the crystal maintains the crystal in a dampened energy transmission and receiving position whereby collimated energy signals are available for human tissue analysis.

8. The structure as set forth in claim 7 wherein the energy signals are maintained at a selected fundamental frequency.

9. The structure as set forth in claim 1 and the piezo-electric crystal being circular in shape.

10. The structure as set forth in claim 1 and the piezo-electric crystal being rectangular in shape.

11. The structure as set forth in claim 10 and:

a. said housing being of a dimension for positioning at least a pair of crystals in side-by-side position therein; and, b. said shouldered end of said housing providing individual mounting of each crystal in edge mounted position within said framework.

12. The structure as set forth in claim 11 and individual compressive conductor members, energy providing means and compressive force applying means provided for each of such crystals.

* * * * *